(12) United States Patent
Teo

(10) Patent No.: US 11,838,659 B2
(45) Date of Patent: Dec. 5, 2023

(54) IMAGE SENSING SYSTEM AND IMAGE SENSING DATA PROCESSING METHOD

(71) Applicant: PixArt Imaging Inc., Hsin-Chu (TW)

(72) Inventor: Wai Lian Teo, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 116 days.

(21) Appl. No.: 17/528,149

(22) Filed: Nov. 16, 2021

(65) Prior Publication Data
US 2023/0156359 A1 May 18, 2023

(51) Int. Cl.
*H04N 25/617* (2023.01)
*G11C 19/38* (2006.01)
*H04N 25/78* (2023.01)

(52) U.S. Cl.
CPC ........... *H04N 25/617* (2023.01); *G11C 19/38* (2013.01); *H04N 25/78* (2023.01)

(58) Field of Classification Search
CPC ............. H04N 5/3577; H04N 5/37452; H04N 5/37455; H04N 25/78; G11C 19/38
USPC ...................................................... 348/231.99
See application file for complete search history.

(56) References Cited

U.S. PATENT DOCUMENTS

| | | | | |
|---|---|---|---|---|
| 4,426,629 A * | 1/1984 | Fouse | ....................... | G06T 5/20 257/241 |
| 5,148,013 A * | 9/1992 | Yamada | ............ | H01L 27/14831 257/241 |
| 2005/0104982 A1* | 5/2005 | Shimazu | .............. | H04N 25/445 348/E3.02 |
| 2010/0002100 A1* | 1/2010 | Master | .................. | G06F 7/5443 348/E5.051 |

* cited by examiner

*Primary Examiner* — Lin Ye
*Assistant Examiner* — Chan T Nguyen
(74) *Attorney, Agent, or Firm* — Winston Hsu

(57) ABSTRACT

An image sensing system comprising: a storage device, comprising at least two first registers, wherein a number of the first registers following a first direction of the storage device is larger than a number of the first registers following a second direction of the storage device; a filter, comprising at least two second registers; and an SIPO (serial in parallel out) circuit, coupled between the storage device and the filter.

16 Claims, 7 Drawing Sheets

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 |
|---|---|---|---|---|---|---|---|---|---|---|---|---|---|---|---|---|---|---|---|---|---|---|---|---|---|---|---|---|---|---|---|---|---|---|---|
| 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 | 69 | 70 | 71 |
| 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 | 96 | 97 | 98 | 99 | 100 | 101 | 102 | 103 | 104 | 105 | 106 | 107 |
| 108 | 109 | 110 | 111 | 112 | 113 | 114 | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 | 138 | 139 | 140 | 141 | 142 | 143 |
| 144 | 145 | 146 | 147 | 148 | 149 | 150 | 151 | 152 | 153 | 154 | 155 | 156 | 157 | 158 | 159 | 160 | 161 | 162 | 163 | 164 | 165 | 166 | 167 | 168 | 169 | 170 | 171 | 172 | 173 | 174 | 175 | 176 | 177 | 178 | 179 |
| 180 | 181 | 182 | 183 | 184 | 185 | 186 | 187 | 188 | 189 | 190 | 191 | 192 | 193 | 194 | 195 | 196 | 197 | 198 | 199 | 200 | 201 | 202 | 203 | 204 | 205 | 206 | 207 | 208 | 209 | 210 | 211 | 212 | 213 | 214 | 215 |

IMAGE SENSING SYSTEM AND IMAGE SENSING DATA PROCESSING METHOD

BACKGROUND OF THE INVENTION

1. Field of the Invention

The present invention relates to an image sensing system and an image sensing data processing method, and particularly relates to an image sensing system and an image sensing data processing method which can reduce power consumption for image sensing data processing.

2. Description of the Prior Art

Existing images processing architecture, may comprise a filter for processing image sensing data and a storage device (or named a pixel storage) formed by an array of shift registers (e.g., flip flop) to store the image sensing data. However, for such architecture, shift registers of the storage device and flip flops of the filter are clocking simultaneous on every clock pulse in order to shift received image sensing data, thus causes high power consumption.

For example, if the filter is a 4×4 filter and receives 8 bits image sensing data, the filter comprises 4×4×8=128 shift registers. Also, if the storage device comprises 3 rows and each of the rows comprises 32 shift registers and receives 8 bits image sensing data, the storage device comprises 3×32×8=768 shift registers. For such example, a total number of 896 flip flops get clocked simultaneously on every clock pulse, thus causes high power consumption.

SUMMARY OF THE INVENTION

One objective of the present invention is to provide an image system which can reduce power consumption.

Another objective of the present invention is to provide an image sensing data processing method which can reduce power consumption.

One embodiment of the present invention discloses an image sensing system comprising: a storage device, comprising at least two first registers, wherein a number of the first registers following a first direction of the storage device is larger than a number of the first registers following a second direction of the storage device; a filter, comprising at least two second registers; and an SIPO (serial in parallel out) circuit, coupled between the storage device and the filter.

Another embodiment of the present invention discloses an image sensing data processing method, applied to a storage device comprising at least two first registers and a filter comprising at least two second registers, comprising: reading image sensing data in the first registers following a second direction of the storage device in series, wherein a number of the first registers following a first direction of the storage device is larger than a number of the first registers following the second direction of the storage device; and writing the image sensing data to the second registers based on an address of the first registers which is read in series.

In view of above-mentioned embodiments, the power consumption can be greatly reduced, since only a small number of registers need to be activated while reading and writing data.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a schematic diagram illustrating the pixel array 101 in FIG. 1, according to one embodiment of the present invention.

FIG. 5-FIG. 6 are schematic diagrams illustrating operations of the image sensing system illustrated in FIG. 1, according to one embodiment of the present invention.

DETAILED DESCRIPTION

Several embodiments are provided in following descriptions to explain the concept of the present invention. Each component in following descriptions can be implemented by hardware (e.g. a device or a circuit) or hardware with software (e.g. a program installed to a processor). Besides, the method in following descriptions can be executed by programs stored in a non-transitory computer readable recording medium such as a hard disk, an optical disc or a memory. Additionally, the term "first", "second", "third" in following descriptions are only for the purpose of distinguishing different one elements, and do not mean the sequence of the elements. For example, a first device and a second device only mean these devices can have the same structure but are different devices.

Figure 1:
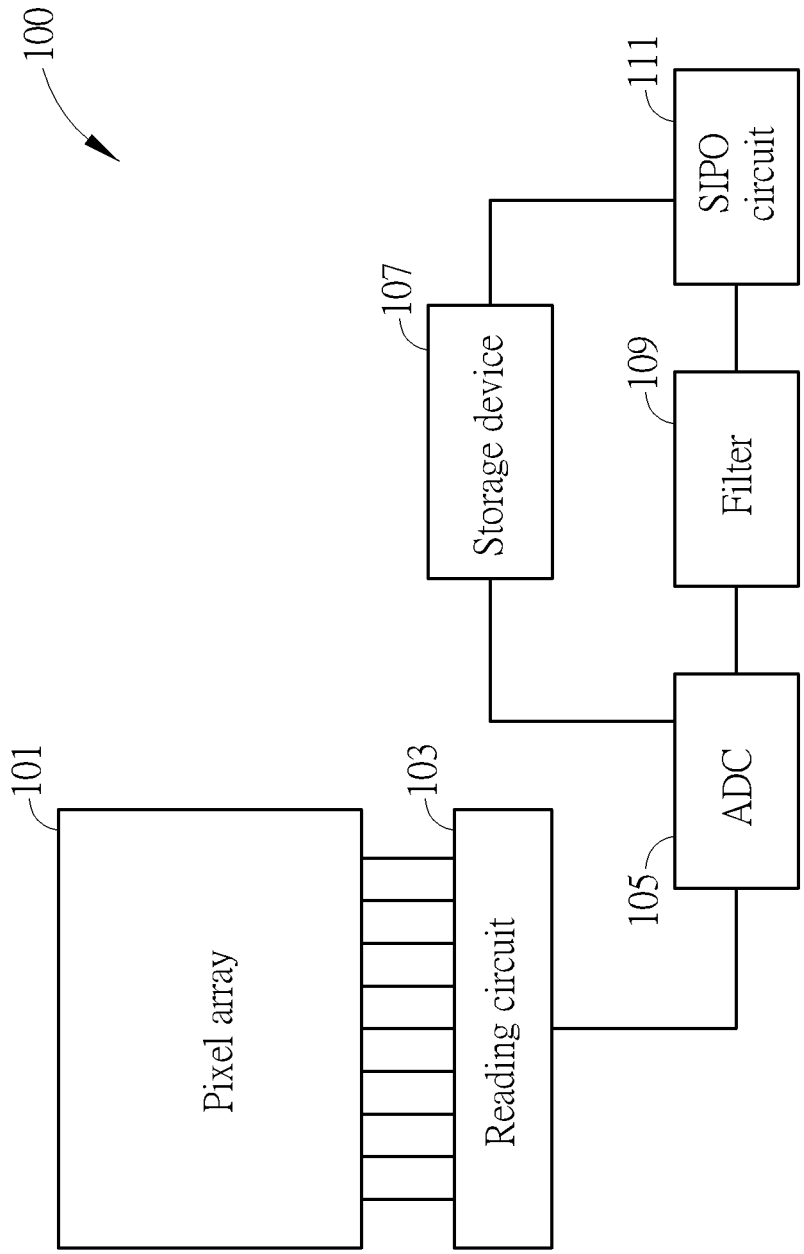
FIG. 1 is a block diagram illustrating an image sensing system according to one embodiment of the present invention.

FIG. 1 is a block diagram illustrating an image sensing system according to one embodiment of the present invention. As illustrated in FIG. 1, the image sensing system 100 comprises a pixel array 101, a reading circuit 103, an ADC (Analog to Digital Converter) 105, a storage device 107, a filter 109 and a SIPO (Serial In Parallel Out) circuit 111.

The pixel array 101 comprises at least one pixel, and is configured to generate image sensing data (e.g., image sensing charges). The reading circuit 103 is configured to read image sensing data from the pixel array 101. The ADC 105 is configured to convert the image sensing data to digital image sensing values. The storage device 107 comprising at least two first registers (e.g., flip flop). A number of the first registers following a first direction of the storage device 107 is larger than a number of the first registers following a second direction of the storage device 107. In one embodiment, the first registers following the first direction means the first registers in a row of the storage device 107 and the first registers following the second direction means the first registers in a column of the storage device 107. In other words, a number of the first registers in a row of the storage device 107 is larger than a number of the first registers in a column of the storage device 107. The storage device 107 can be, for example, a memory device, or any other electronic device which can register data.

The filter 109 comprises at least two second registers. The first registers and the second registers can be shift registers. The SIPO circuit 111 is coupled between the storage device 107 and the filter 109. The filter 109 and the storage device 107 respectively receives at least partial of the digital image sensing values from the ADC 105. Also, the SIPO 111 is configured to read data in the first registers following the second direction of the storage device 107, and is configured to write the data to the second register in the filter 109 based on an address of the first registers which is read. Additionally, in one embodiment, the filter 109 is configured to filter noises of the digital image sensing values. Detail operations of the storage device 107, the filter 109 and the SIPO 111 will be described for more detail later.

Figure 2:
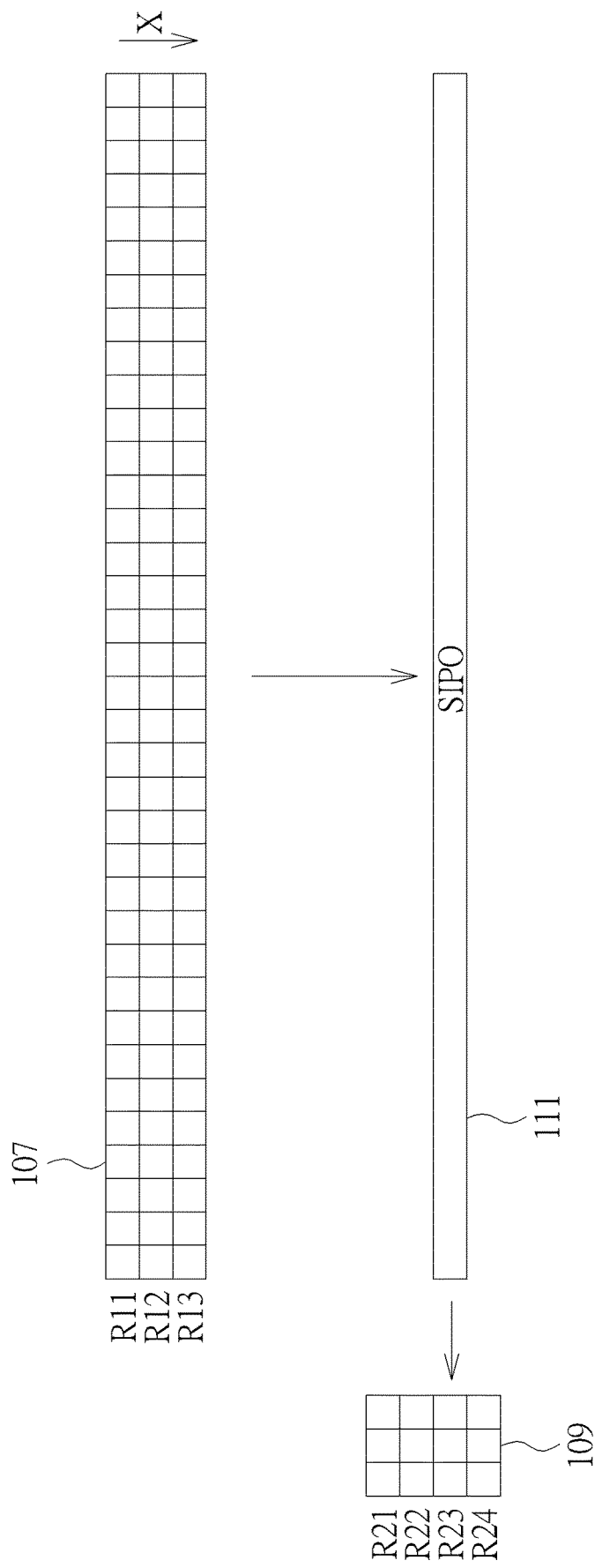
FIG. 2 is a schematic diagram illustrating detail structures of the filter and the storage device in FIG. 1 of the present application, according to one embodiment of the present invention.

FIG. 2 is a schematic diagram illustrating detail structures of the filter and the storage device in FIG. 1 of the present application, according to one embodiment of the present invention. As illustrated in FIG. 2, the storage device 107 comprises 36×3 first registers, which are indicated by squares. Also, the filter 109 comprises 4×4 second registers, which are indicated by squares as well. Further, the SIPO circuit 111 is configured to read the data stored in the first registers of the storage device 107 in a column direction (the X direction illustrated in FIG. 2), and shifts the read data to second registers of the filter 109 based on column addresses of the read first registers.

Figure 3:
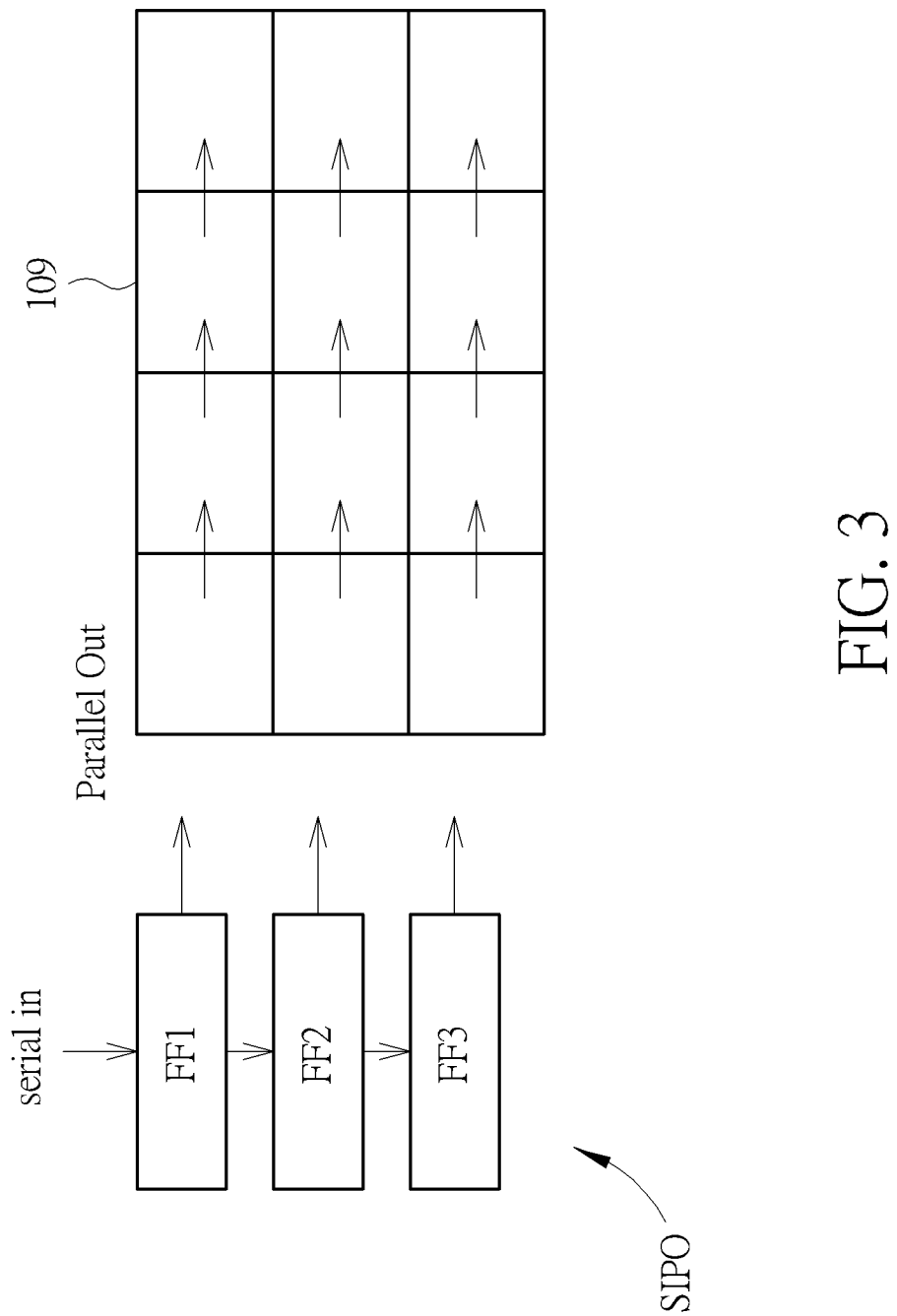
FIG. 3 is a schematic diagram illustrating operations of the filter and the storage device in FIG. 2, according to one embodiment of the present invention.

FIG. 3 is a schematic diagram illustrating operations of the filter and the storage device in FIG. 2, according to one embodiment of the present invention. In the embodiment of FIG. 3. the SIPO circuit 111 comprises a plurality of flip flops FF1, FF2 and FF3, which are configured to shift the data from the storage device 107 to the filter 109. Data in first registers in a row of the storage device 107 is shifted to a corresponding row of the second registers via the SIPO circuit 111, even if the first registers are read following a column direction. For example, the data in the row R11 of the storage device 107 is shifted to the row R22 of the second registers via the SIPO circuit 111 via the SIPO circuit 111. For another example, the data in the row R12 of the storage device 107 is shifted to the row R23 of the second registers via the SIPO circuit 111 via the SIPO circuit 111. Detail operations will be described in following examples.

FIG. 4 is a schematic diagram illustrating the pixel array 101 in FIG. 1, according to one embodiment of the present invention. As illustrated in FIG. 4, the pixel array has 36×6 pixels, which correspond to digital data sensing values 0-215. Please note 0-215 here only mean the sequences of the pixels to which the digital data sensing values corresponding, and do not mean real values of the digital data sensing values.

Figure 5:
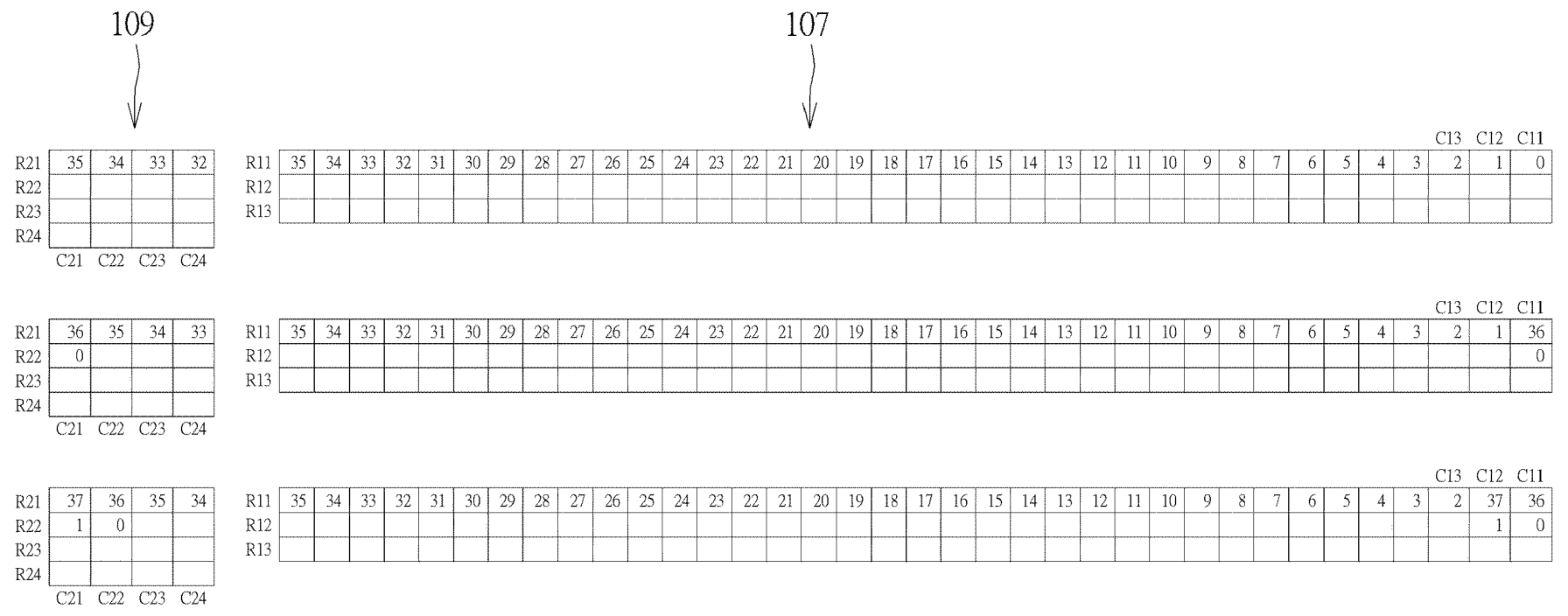
Figure 6:
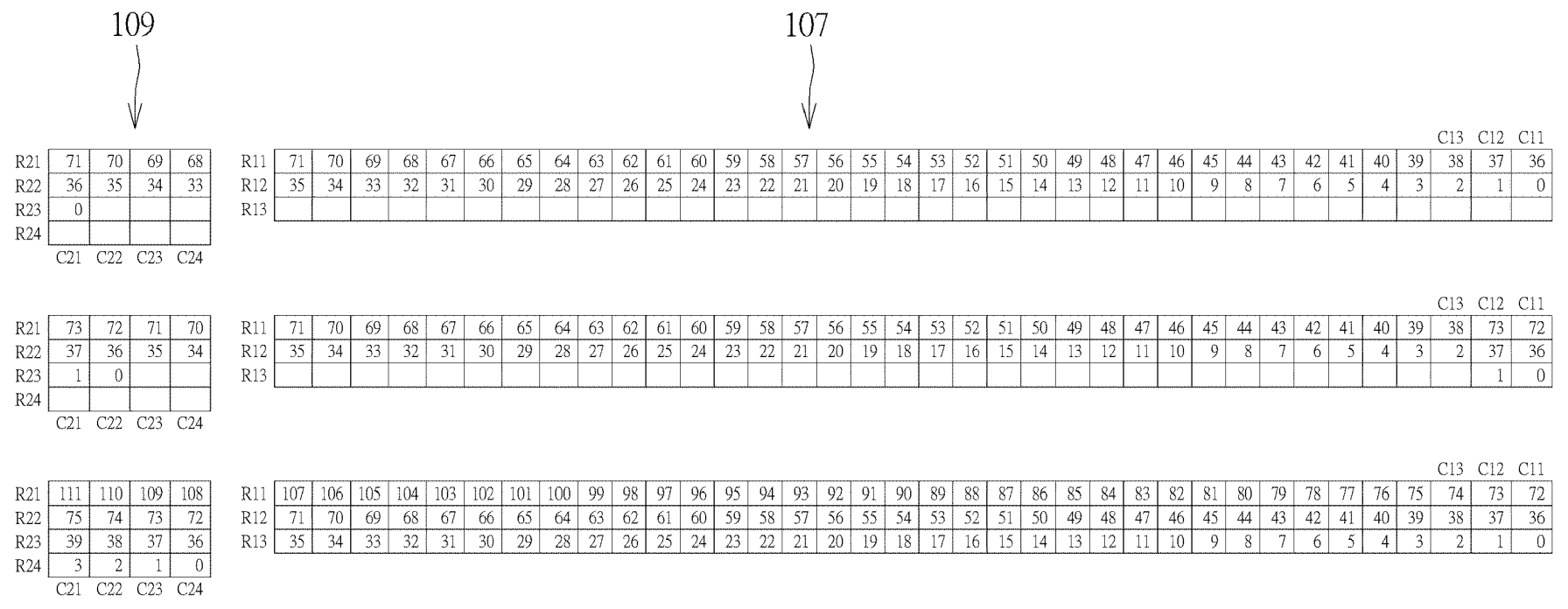

FIG. 5-FIG. 6 are schematic diagrams illustrating operations of the image sensing system illustrated in FIG. 1, according to one embodiment of the present invention. Please note, in the embodiments of FIG. 5 and FIG. 6, the rows R11, R21 respectively mean the first row of the first registers in the storage device 107 and the first row of the second registers in the filter 109. However, any row of the first registers in the storage device 107 and any row of the second registers in the filter 109 can be set as the first row.

In the embodiment of FIG. 5, the digital image sensing values are shifted to the first registers and correspondingly copied to the second register until a first row of the first registers is filled up with the digital image sensing values. For example, the digital image sensing values 0-35 are input to first registers in the row R11 and copied to second registers in the row R21. Therefore, after the digital image sensing values 0-35 are input to first registers in the row R11, second registers in the row R21 store digital sensing values 32-35. After that, the digital image sensing value 36 is input to the second register at the row R21 and the column C21 and to the first register at the row R11 and the column C11. In such case, the digital image sensing value 0 which is originally stored in the first register at the row R11 and the column C11 is shifted to the first register at the next row (row R12) and the same column (the column C11) and is copied to the second register at the row R22 and the column C21. In such case, the digital image sensing values 35-33 in the row R21 are shifted.

Then, the digital image sensing value 37 is input to the second register at the row R21 and the column C21 and to the first register at the row R11 and the column C12. The digital image sensing value 1 which is originally stored in the first register at the row R11 and the column C12 is shifted to the first register at the row R12 (the next row) and the column C12 and is copied to the second register at the row R22 and the column C21. In such case, the digital image sensing value 0 stored in the second register at the row R22 and the column C21 is shifted to the second register at the row R22 and the column C22. Also, the digital image sensing values 36-34 in second registers of the row R21 are shifted.

The operations illustrated in FIG. 5 can be summarized as: while writing a new digital image sensing value (e.g., 36) from the ADC 105 to the first row of the second registers after the first row of the first registers is filled up with the digital image sensing values, the new digital image sensing value is written to a last second register in the first row of the second registers (e.g., the second register at row R11 column C11). Also, the digital image sensing value registered in an N-th (e.g., N=1) first register in the first row of the first registers is shifted to a N-th first register in a second row of the first registers, and the digital image sensing value which is shifted to the N-th first register in the second row of the first registers is copied to the second register in the second row and a first column of the second registers (e.g., the second register at row E22 and column C21). N means a number of times that the new digital image sensing value from the ADC is written to the first row of the second registers. There, in such embodiment, when N=2, the new digital image sensing value is 37 and the digital image sensing value 1 is copied to the second register at row E22 and column C21 following the same way.

Additionally, the digital image sensing value copied to the second register at the second row and the first column of the second registers is shifted to the second register in the second row and a M-th column of the second registers when N is larger than 1, M=N. For example, when N=2, the digital image sensing value 37 is input to the storage device 107 and the digital image sensing value 1 is shifted to the first register at the row R12 and column C12. In such case, the digital image sensing value 0 stored in the second register at the row R21 and the column C21 is shifted to the second register at the row R21 and the column C22.

The rules stated in FIG. 5 can be repeated, as shown FIG. 6, until all image sensing data generated by one time sensing of the pixel array 109 has been processed. Also, the filter 109 performs the pixels transformation calculation (i.e., noise filtering) after all of the second registers are filled up with the digital image sensing values. Please note, in the embodiment of FIG. 6, while writing a new digital image sensing value (e.g., 72) from the ADC to the first row of the second registers after the second row of the first registers is filled up with the digital image sensing values, the new digital image sensing value is written to the last second register (e.g., the second register at row R21, column C21), the digital image sensing value (e.g., 0) registered in a K-th (in this embodiment, K=1) first register in the second row of the first registers is shifted to a K-th first register in a third row of the first registers (e.g., the first register at row R13 column C11), and the digital image sensing value which is shifted to the K-th first register in the third row of the first registers is copied to the second register at the third row and a first column of the second registers (e.g., the second register at row R23 column C21). K means a number of times that the new digital image sensing value from the ADC is written to the first row of the second registers after the second row of the first registers is filled up with the digital image sensing values.

In above-mentioned embodiments, only the registers in the column of the storage device 107 need to be activated while reading data, rathe than all registers in the storage device 107, thus the power consumption can be greatly reduced.

Figure 7:
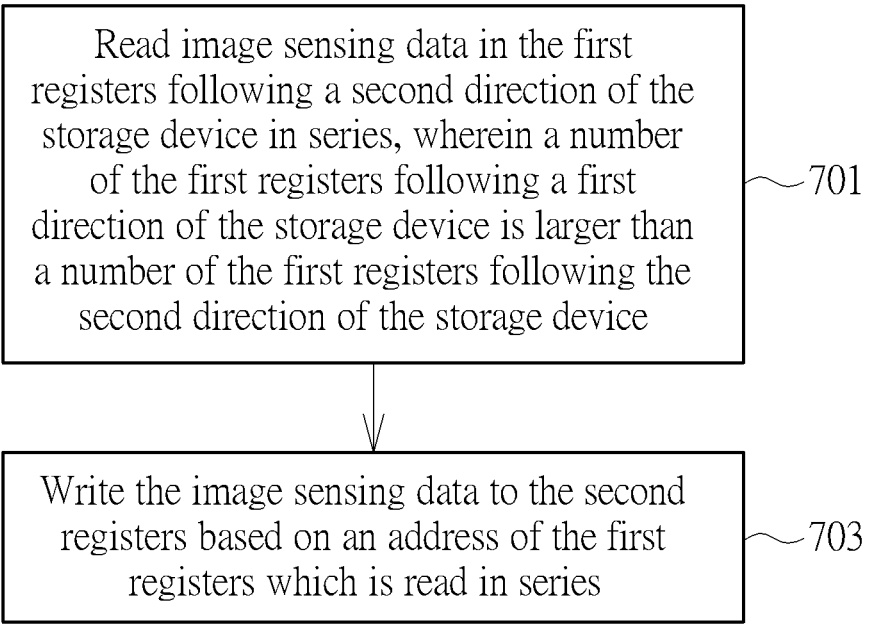
FIG. 7 is a flow chart illustrating an image sensing data processing method according to one embodiment of the present invention.

Based on above-mentioned descriptions, an image sensing data processing method can be acquired, which is applied to a storage device (e.g., the storage device 107) comprising at least two first registers and a filter (e.g., the filter 109) comprising at least two second registers. FIG. 7 is a flow chart illustrating an image sensing data processing method according to one embodiment of the present invention, which comprises:

Step 701

Read image sensing data in the first registers following a second direction of the storage device in series, wherein a number of the first registers following a first direction of the storage device is larger than a number of the first registers following the second direction of the storage device.

In one embodiment, the first registers following the first direction means the first registers in a row of the storage device and the first registers following the second direction means the first registers in a column of the storage device.

Step 703

Write the image sensing data to the second registers based on an address of the first registers which is read in series.

The read and write operations can be performed by a SIPO circuit, such as the SIPO circuit illustrated in FIG. 1.

In view of above-mentioned embodiments, the power consumption can be greatly reduced, since only a small number of registers need to be activated while reading and writing data.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensing system, comprising:
 a storage device, comprising at least two first registers, wherein a number of the first registers following a first direction of the storage device is larger than a number of the first registers following a second direction of the storage device;
 a filter, comprising at least two second registers; and
 an SIPO (serial in parallel out) circuit, coupled between the storage device and the filter;
 wherein the image sensing system further comprising;
 a pixel array, comprising at least one pixel, configured to generate image sensing data;
 an ADC (Analog to Digital Converter), configured to convert the image sensing data to digital image sensing values;
 wherein the filter and the storage device respectively receives at least partial of the digital image sensing values;
 wherein the digital image sensing values are shifted to the first registers and correspondingly copied to the second registers until a first row of the first registers is filled up with the digital image sensing values.

2. The image sensing system of claim 1, wherein the SIPO is configured to read data in the first registers following the second direction of the storage device, and configured to write the data to the second registers based on an address of the first registers which is read.

3. The image sensing system of claim 1, wherein the filter is configured to filter noises of the digital image sensing values.

4. The image sensing system of claim 1, wherein the first registers following the first direction means the first registers in a row of the storage device and the first registers following the second direction means the first registers in a column of the storage device.

5. The image sensing system of claim 1,
 while writing a new digital image sensing value from the ADC to the first row of the second registers after the first row of the first registers is filled up with the digital image sensing values, the new digital image sensing value is written to a last second register in the first row of the second registers, the digital image sensing value registered in an N-th first register in the first row of the first registers is shifted to a N-th first register in a second row of the first registers, and the digital image sensing value which is shifted to the N-th first register in the second row of the first registers is copied to the second register at the second row and a first column of the second registers;
 wherein N means a number of times that the new digital image sensing value from the ADC is written to the first row of the second registers.

6. The image sensing system of claim 5, wherein the digital image sensing value copied to the second register in the second row and the first column of the second registers is shifted to the second register in the second row and a M-th column of the second registers when N is larger than 1, M=N.

7. The image sensing system of claim 6, wherein the filter performs the pixels transformation calculation after all of the second registers are filled up with the digital image sensing values.

8. The image sensing system of claim 5,
 while writing a new digital image sensing value from the ADC to the first row of the second registers after the second row of the first registers is filled up with the digital image sensing values, the new digital image sensing value is written to the last second register, the digital image sensing value registered in a K-th first register in the second row of the first registers is shifted to a K-th first register in a third row of the first registers, and the digital image sensing value which is shifted to the K-th first register in the third row of the first registers is copied to the second register at the third row and a first column of the second registers;
 wherein K means a number of times that the new digital image sensing value from the ADC is written to the first row of the second registers after the second row of the first registers is filled up with the digital image sensing values.

9. An image sensing data processing method, applied to a storage device comprising at least two first registers and a filter comprising at least two second registers, comprising:
reading image sensing data in the first registers following a second direction of the storage device in series, wherein a number of the first registers following a first direction of the storage device is larger than a number of the first registers following the second direction of the storage device; and
writing the image sensing data to the second registers based on an address of the first registers which is read in series;
wherein the image sensing system further comprises:
a pixel array, comprising at least one pixel, configured to generate the image sensing data;
an ADC (Analog to Digital Converter), configured to convert the image sensing data to the digital image sensing values;
wherein the digital image sensing values are shifted to the first registers and correspondingly copied to the second registers until a first row of the first registers is filled up with the digital image sensing values.

10. The image sensing data processing method of claim 9, wherein the filter is configured to filter noises of the digital image sensing values.

11. The image sensing data processing method of claim 9, wherein the first registers following the first direction means the first registers in a row of the storage device and the first registers following the second direction means the first registers in a column of the storage device.

12. The image sensing data processing method of claim 9, further comprising:
while writing a new digital image sensing value from the ADC to the first row of the second registers after the first row of the first registers is filled up with the digital image sensing values, the new digital image sensing value is written to a last second register in the first row of the second registers, the digital image sensing value registered in an N-th first register in the first row of the first registers is shifted to a N-th first register in a second row of the first registers, and the digital image sensing value which is shifted to the N-th first register in the second row of the first registers is copied to the second register at the second row and a first column of the second registers;
wherein N means a number of times that the new digital image sensing value from the ADC is written to the first row of the second registers.

13. The image sensing data processing method of claim 12, wherein the digital image sensing value copied to the second register in the second row and the first column of the second registers is shifted to the second register in the second row and a M-th column of the second registers when N is larger than 1, M=N.

14. The image sensing data processing method of claim 13, wherein the filter performs the pixels transformation calculation after all of the second registers are filled up with the digital image sensing values.

15. The image sensing data processing method of claim 12,
while writing a new digital image sensing value from the ADC to the first row of the second registers after the second row of the first registers is filled up with the digital image sensing values, the new digital image sensing value is written to the last second register, the digital image sensing value registered in a K-th first register in the second row of the first registers is shifted to a K-th first register in a third row of the first registers, and the digital image sensing value which is shifted to the K-th first register in the third row of the first registers is copied to the second register at the third row and a first column of the second registers;
wherein K means a number of times that the new digital image sensing value from the ADC is written to the first row of the second registers after the second row of the first registers is filled up with the digital image sensing values.

16. An image sensing system, comprising:
a storage device, comprising at least two first registers, wherein a number of the first registers following a first direction of the storage device is larger than a number of the first registers following a second direction of the storage device;
a filter, comprising at least two second registers; and
an SIPO (serial in parallel out) circuit, coupled between the storage device and the filter;
wherein the image sensing system further comprises;
a pixel array, comprising at least one pixel, configured to generate image sensing data;
an ADC (Analog to Digital Converter), configured to convert the image sensing data to digital image sensing values;
wherein the filter and the storage device respectively receives at least partial of the digital image sensing values;
wherein the first registers following the first direction means the first registers in a row of the storage device and the first registers following the second direction means the first registers in a column of the storage device.

* * * * *